(12) United States Patent
Mehrotra et al.

(10) Patent No.: US 10,749,023 B2
(45) Date of Patent: Aug. 18, 2020

(54) VERTICAL TRANSISTOR WITH EXTENDED DRAIN REGION

(71) Applicant: NXP USA, INC., Austin, TX (US)

(72) Inventors: Saumitra Raj Mehrotra, Scottsdale, AZ (US); Bernhard Grote, Phoenix, AZ (US); Ljubo Radic, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/174,955

(22) Filed: Oct. 30, 2018

(65) Prior Publication Data
US 2020/0135916 A1    Apr. 30, 2020

(51) Int. Cl.
| H01L 29/78 | (2006.01) |
| H01L 29/66 | (2006.01) |
| H01L 29/40 | (2006.01) |
| H01L 27/088 | (2006.01) |
| H01L 29/08 | (2006.01) |
| H01L 21/28 | (2006.01) |
| H01L 21/8234 | (2006.01) |
| H01L 29/417 | (2006.01) |

(52) U.S. Cl.
CPC .... *H01L 29/7809* (2013.01); *H01L 21/28176* (2013.01); *H01L 21/823425* (2013.01); *H01L 21/823487* (2013.01); *H01L 27/088* (2013.01); *H01L 29/0882* (2013.01); *H01L 29/407* (2013.01); *H01L 29/41741* (2013.01); *H01L 29/6656* (2013.01); *H01L 29/66719* (2013.01); *H01L 29/66734* (2013.01)

(58) Field of Classification Search
CPC ............. H01L 29/7809; H01L 29/6656; H01L 29/66734; H01L 29/407; H01L 29/41741; H01L 21/823425; H01L 21/823487
See application file for complete search history.

(56) References Cited

U.S. PATENT DOCUMENTS

| 4,553,151 A | 11/1985 | Schutten et al. |
| 4,893,160 A | 1/1990 | Blanchard |
| 5,316,959 A | 5/1994 | Kwan et al. |
| 5,324,683 A | 6/1994 | Fitch et al. |
| 5,407,860 A | 4/1995 | Stoltz et al. |
| 5,434,435 A | 7/1995 | Baliga |
| 5,723,891 A | 3/1998 | Malhi |

(Continued)

FOREIGN PATENT DOCUMENTS

WO    2005093841 A2    10/2005

OTHER PUBLICATIONS

Notice of Allowance dated Sep. 25, 2019 in U.S. Appl. No. 15/715,831.

(Continued)

*Primary Examiner* — Hsien Ming Lee
(74) *Attorney, Agent, or Firm* — David G. Dolezal

(57) ABSTRACT

A transistor device includes a channel region including a portion located in a vertical sidewall of semiconductor material and an extended drain region including a portion located in a lower portion of the semiconductor material. In one embodiment, a control terminal of the transistor device is formed by forming a conductive sidewall spacer structure adjacent to the sidewall and a field plate for the transistor device is formed by forming a second conductive sidewall spacer structure.

13 Claims, 13 Drawing Sheets

(56) References Cited

U.S. PATENT DOCUMENTS

| | | | |
|---|---|---|---|
| 5,736,446 | A | 4/1998 | Wu et al. |
| 5,770,507 | A | 6/1998 | Chen et al. |
| 5,869,379 | A | 2/1999 | Gardner et al. |
| 5,914,519 | A | 6/1999 | Chou et al. |
| 6,064,107 | A | 5/2000 | Yeh et al. |
| 6,277,700 | B1 | 8/2001 | Yu et al. |
| 6,858,500 | B2 | 2/2005 | Sugi et al. |
| 6,861,332 | B2 | 3/2005 | Park et al. |
| 6,864,135 | B2 | 3/2005 | Grudowski et al. |
| 6,946,348 | B2 | 9/2005 | Zeng |
| 7,368,785 | B2 | 5/2008 | Chen et al. |
| 7,400,024 | B2 | 7/2008 | Kunnen |
| 7,576,388 | B1 | 8/2009 | Wilson et al. |
| 7,709,889 | B2 | 5/2010 | Moens et al. |
| 7,759,206 | B2 | 7/2010 | Luo et al. |
| 7,800,167 | B2 | 9/2010 | Kitamura et al. |
| 7,893,488 | B2 | 2/2011 | Hebert |
| 7,923,776 | B2 | 4/2011 | Yilmaz et al. |
| 8,043,913 | B2 | 10/2011 | Yilmaz et al. |
| 8,304,312 | B2 | 11/2012 | Hebert |
| 8,319,278 | B1 | 11/2012 | Zeng et al. |
| 8,329,538 | B2 | 12/2012 | Pan et al. |
| 8,502,287 | B2 | 8/2013 | Radic et al. |
| 8,647,950 | B2 | 2/2014 | Zuniga et al. |
| 8,716,794 | B2 | 5/2014 | Xiaorong et al. |
| 8,742,495 | B2 | 6/2014 | Parthasarathy et al. |
| 8,981,470 | B2 | 3/2015 | Nozu |
| 9,171,931 | B2 | 10/2015 | Ng et al. |
| 9,559,198 | B2 | 1/2017 | Stefanov et al. |
| 9,620,583 | B2 | 4/2017 | Kelkar et al. |
| 10,103,257 | B1 | 10/2018 | Qin et al. |
| 2004/0021233 | A1 | 2/2004 | Kinzer et al. |
| 2004/0022123 | A1 | 2/2004 | Kinzer et al. |
| 2006/0001084 | A1 | 1/2006 | Kelly et al. |
| 2006/0017078 | A1 | 1/2006 | Thapar |
| 2006/0209586 | A1 | 9/2006 | Hirler |
| 2009/0256212 | A1 | 10/2009 | Denison et al. |
| 2010/0006929 | A1 | 1/2010 | Andou |
| 2010/0015770 | A1 | 1/2010 | Tai et al. |
| 2010/0244125 | A1 | 9/2010 | Sonsky et al. |
| 2013/0105888 | A1 | 5/2013 | Zuniga et al. |
| 2013/0181723 | A1 | 7/2013 | Mauder et al. |
| 2013/0334565 | A1 | 12/2013 | Hutzler et al. |
| 2014/0021534 | A1 | 1/2014 | Verma et al. |
| 2014/0097492 | A1 | 4/2014 | Yu |
| 2014/0138739 | A1 | 5/2014 | Magri et al. |
| 2014/0225186 | A1 | 8/2014 | Abou-Khalil et al. |
| 2015/0084123 | A1 | 3/2015 | Kawashiri et al. |
| 2015/0137223 | A1 | 5/2015 | Siemieniec et al. |
| 2015/0380348 | A1 | 12/2015 | Noebauer et al. |
| 2015/0380538 | A1 | 12/2015 | Ogawa |
| 2016/0020315 | A1 | 1/2016 | Hirler |
| 2016/0211348 | A1 | 7/2016 | Yoshida |
| 2016/0359029 | A1 | 12/2016 | Zeng et al. |
| 2017/0263767 | A1 | 9/2017 | Nishiwaki |
| 2017/0338337 | A1 | 11/2017 | Bobde et al. |
| 2018/0006026 | A1 | 1/2018 | Lui |
| 2018/0006109 | A1 | 1/2018 | Mauder et al. |
| 2018/0090490 | A1* | 3/2018 | Lin ............... H01L 27/0883 |
| 2019/0097046 | A1 | 3/2019 | Mehrotra et al. |
| 2019/0206987 | A1 | 7/2019 | Adachi et al. |

OTHER PUBLICATIONS

Non-final office action dated Feb. 21, 2019 in U.S. Appl. No. 15/715,816.

Ex-Parte Quayle action dated Mar. 5, 2019 in U.S. Appl. No. 15/715,852.

Non-final office action dated Apr. 9, 2019 in U.S. Appl. No. 15/715,831.

Fujishima, D.H., "Integrated Bi-directional Trench Lateral Power MOSFETs for One Chip Lithium-ion Battery Protection ICs", Proceedings of the 17 International Symposium on Power Semiconductor Devices & IC's, Santa Barbara, CA, May 23-26, 2005.

Huang, T., "0.18um BCD Technology with Best-in-Class LDMOS from 6 V to 45 V"", Proceedings of the 26th International Symposium on Power Semiconductor Devices & IC's, Jun. 15-19, 2014.

Kumar, M., "Extended-p+ Stepped Gate LDMOS for Improved Performance", IEEE Transactions on Electron Devices, vol. 57, No. 7, Jul. 2010.

Lu, D.H., "Integrated Bi-directional Trench Lateral Power MOSFETs for One Chip Lithium-ion Battery Protection ICs", Proceedings of the 17th International Symposium on Power Semiconductor Devices & IC's, May 23-26, 2005.

Takaya, H., "Floating Island and Thick Bottom Oxide Trench Gate MOSFET (FITMOS)-A 60V Ultra Low On-Resistance Novel MOSFET with Superior Internal Body Diode-", Proceedings of the 17th International Symposium on Power Semiconductor Devices & IC's, May 23-26, 2005.

Zhigang, W., "Analysis of OFF-state and ON-state performance in a silicon-on-insulator power MOSFET with a low-k dielectric trench", Chinese Institute of Electronics, Journal of Semiconductors, vol. 34, No. 7, Jul. 2013.

U.S. Appl. No. 15/715,816, filed Sep. 26, 2017, entitled "Field-Effect Transistor and Method Therefor".

U.S. Appl. No. 15/715,831, filed Sep. 26, 2017, entitled "Field-Effect Transistor and Method Therefor".

U.S. Appl. No. 15/715,852, filed Sep. 26, 2017, entitled "Field-Effect Transistor and Method Therefor".

U.S. Appl. No. 15/918,563, filed Mar. 12, 2018, entitled "Transistor Trench Structure With Field Plate Structures".

U.S. Appl. No. 16/141,674, filed Sep. 25, 2018, entitled "Transistor Devices With Control-Terminal Field Plate Structures in Trenches".

U.S. Appl. No. 16/171,830, filed Oct. 26, 2018, entitled "Transistor Devices With Extended Drain Regions Located in Trench Sidewalls".

Non-final office action dated Oct. 15, 2018 in U.S. Appl. No. 15/715,816.

Ex-Parte Quayle action dated Apr. 24, 2019 in U.S. Appl. No. 15/715,852.

Final office action dated Nov. 19, 2019 in U.S. Appl. No. 15/715,816.

Non-final office action dated Aug. 8, 2019 in U.S. Appl. No. 15/715,816.

Non-final office action dated Jul. 25, 2019 in U.S. Appl. No. 15/918,563.

Final office action dated Jun. 7, 2019 in U.S. Appl. No. 15/715,816.

Notice of Allowance dated Jul. 9, 2019 in U.S. Appl. No. 15/715,852.

Final office action dated Jul. 18, 2019 in U.S. Appl. No. 15/715,831.

Non-final office action dated Nov. 16, 2018 in U.S. Appl. No. 15/715,852.

U.S. Appl. No. 16/205,461, filed Nov. 30, 2018, entitled "Transistor With Gate/Field Plate Structure".

Cha, H., "0.18um 100V-rated BCD with Large Area Power LDMOS with ultra-low effective Specific Resistance", IEEE, Jun. 12-16, 2016.

Cheng, K., "Air Spacer for 10nm FinFET CMOS and Beyond", IEEE, Dec. 2016.

Chil, M., "Advanced 300mm 130NM BCD technology from 5V to 85V with Deep-Trench Isolation", IEEE, Jun. 12-16, 2016.

Yang, H., "Low-Leakage SMARTMOS 10W Technology at 0.13um Node with Optimized Analog, Power and Logic Devices for SOC Design", IEEE, Apr. 21-23, 2008.

Yang, H., "Approach to the Silicon Limit: Advanced NLDMOS in 0.13 um SOI Technology for Automotive and Industrial Applications up to 110V", Proceedings of the 25th International Symposium on Power Semiconductor Devices & ICs, Kanazawa; May 2013.

U.S. Appl. No. 16/692,517, filed Nov. 22, 2019, entitled "Transistor Formed With Spacer".

U.S. Appl. No. 16/715,396, filed Dec. 16, 2019, entitled "Transistor With Extended Drain Region".

Notice of Allowance dated Jan. 21, 2020 in U.S. Appl. No. 15/715,816.

Notice of Allowance dated Feb. 4, 2020 in U.S. Appl. No. 15/918,563.

U.S. Appl. No. 16/836,293, filed Mar. 31, 2020, entitled Transistor Trench With Field Plate Structure.

U.S. Appl. No. 16/836,344, filed Mar. 31, 2020, entitled Trench With Different Transverse Cross-Sectional Widths.

(56) References Cited

OTHER PUBLICATIONS

Non-final office action dated May 4, 2020 in U.S. Appl. No. 16/171,830.
Qiao, M., "A Novel Substrate-Assisted Resurf Technology for Small Curvature Radius Junction", Proceedings of the 23rd International Symposium on Power Semiconductor Devices & IC's, May 23-26, 2011.
Notice of Allowance dated Jun. 24, 2020 in U.S. Appl. No. 16/205,461.

* cited by examiner

VERTICAL TRANSISTOR WITH EXTENDED DRAIN REGION

BACKGROUND OF THE INVENTION

Field of the Invention

This invention relates in general to transistor devices and more specifically to vertical transistor devices with extended drain regions.

Background

Some types of transistors such as power transistors, high voltage devices, and RF devices (e.g. laterally diffused metal oxide semiconductor (LDMOS), drain extended MOS (DEMOS)) include extended drain regions located in a carrier path between the drain region and the channel region. An extended drain region of a transistor has the same net conductivity type as the drain region of the transistor. An extended drain region may provide a transistor with a higher breakdown voltage in that most of the voltage applied to the drain region is dropped across the drift region of the extended drain region.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Disclosed herein is a transistor device having a channel region including a portion located in a vertical sidewall of semiconductor material and an extended drain region including a portion located in a lower portion of the semiconductor material. In one embodiment, a control terminal of the transistor device is formed by forming a conductive sidewall spacer structure adjacent to the sidewall and a field plate for the transistor device is formed by forming a second conductive sidewall spacer structure.

One advantage of such a transistor device is that the transistor occupies less area of the device in that the channel region is vertical and yet the device is scalable in that a majority of the extended drain region is horizontally oriented to allow for varying the length of the extended drain region to adjust the desired breakdown voltage. Another advantage in some embodiments is that the gate structure can be formed without the use of a photolithographic mask.

FIGS. 1-10 set forth partial cutaway side views of various stages of a wafer in the manufacture of a transistor device according to one embodiment of the present invention.

Figure 1:
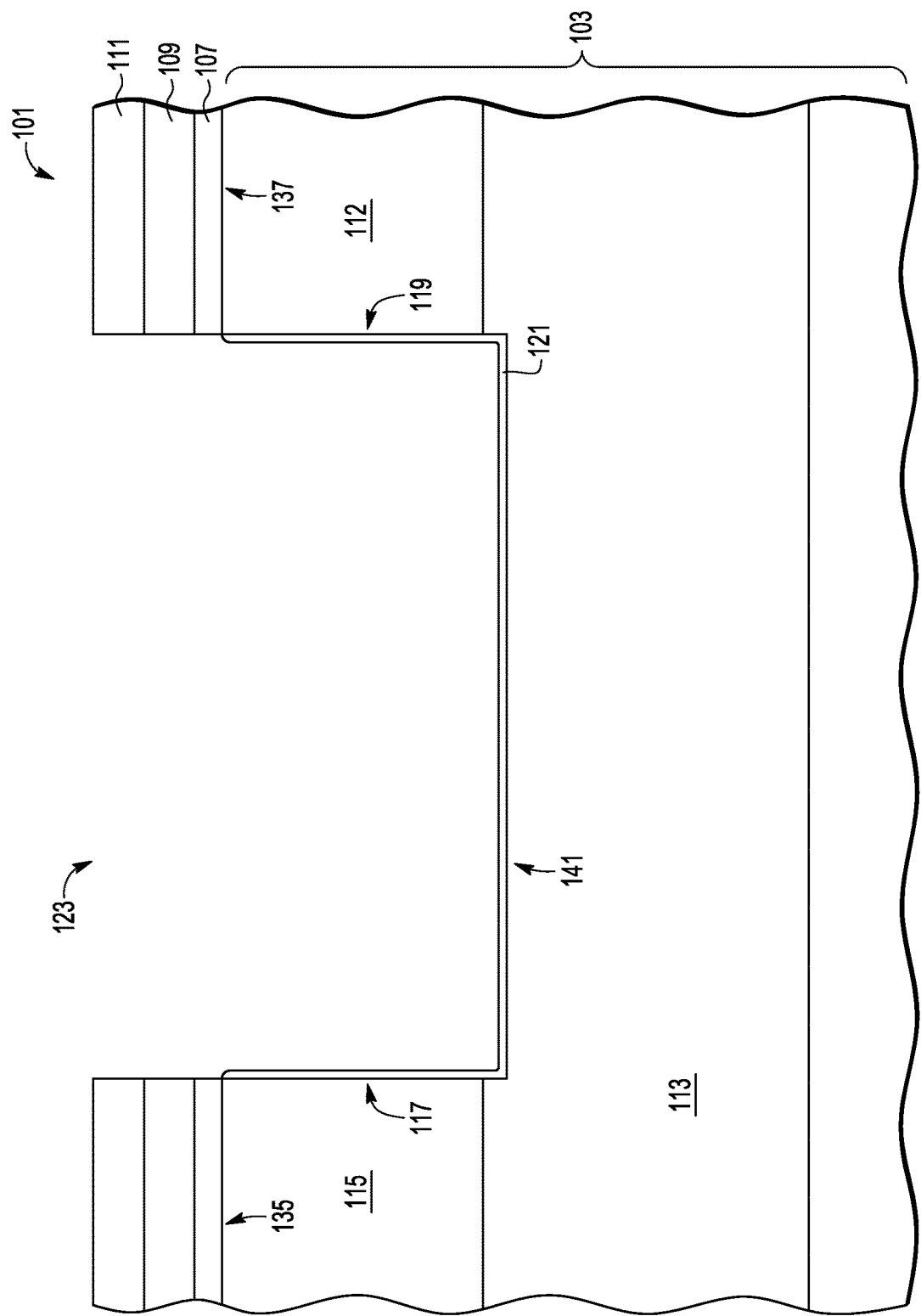
FIGS. 1-10 set forth partial cutaway side views of various stages in the manufacture of a transistor device according to one embodiment of the present invention.

FIG. 1 is a partial cutaway side view showing a portion of wafer 101 with a trench 123 formed therein. In one embodiment, wafer 101 includes a substrate 103 of semiconductor material. In one embodiment, substrate 103 has a net P-type conductivity doping. In one embodiment, substrate 103 is doped with boron and has a net P-type conductivity dopant concentration of about $2e15$ $cm^3$, but may be doped with other types of dopants and/or may be at other concentrations in other embodiments. In one embodiment, substrate 103 is made of monocrystalline silicon, but may be made of other semiconductor materials (e.g. silicon germanium, germanium, silicon carbide, gallium nitride, gallium arsenide, other semiconductor III-V materials) in other embodiments. In yet another embodiment, substrate 103 may be a semiconductor-on-insulator (SOI) substrate where the trenches are formed in the semiconductor layer located above the insulator layer (not shown). In other embodiments, substrate 103 may be made of layers of different semiconductor material and/or include other regions (not shown) of different conductivity types (e.g. a buried N-type region).

Substrate 103 includes a region 113 implanted with N-type dopants. In one embodiment, region 113 is implanted with phosphorous dopants at an energy of 100-1000 keV and at a dosage of $1e11$-$1e13/cm^2$, but may be implanted with other types of dopants, at other energies, and at dosages in other embodiments. In one embodiment, region 113 can be part of a N-type epi growth region with doping concentration $1e16$-$1e18/cm^3$. In one embodiment, after implantation, wafer 101 is annealed where the dopants diffuse to the location of region 113 shown in FIG. 1. After diffusion, the dopants have a desired concentration for extended drain regions for subsequently for transistors.

In FIG. 1, wafer 101 includes two P-well regions 112 and 115 located above region 113 in substrate 103. In one embodiment, P-well regions 112 and 115 are formed by implanting P-type dopants into a top portion of substrate 103. In one embodiment, the P-type dopants are boron and are implanted at an energy a 20-200 keV and at a dosage of $1e11$-$1e13/cm^2$, but may include other types of dopants, implanted at other energies, and at other doping concentrations in other embodiments. In one embodiment, after implantation of the P-type dopants, wafer 101 is annealed where the dopants diffuse to the location of P-well regions 115 and 112 as shown in FIG. 1.

After the implantation of the N-type and P-type dopants, a pad oxide layer 107, nitride layer 109, and oxide layer 111 are formed on substrate 103. Afterwards, a trench 123 is formed in wafer 101. The formation of trench 123 forms vertical sidewalls 117 and 119 in substrate 103 as well as upper surface levels 135 and 137 and lower surface level 141. In one embodiment, trench 123 is formed by forming a patterned mask (not shown) on wafer 101 and then anisotropically etching layers 111, 109, 107, and substrate 103 as per the pattern with the appropriate etch chemistries. In other embodiments, other types of hard mask layers may be utilized in forming trench 123. In one embodiment, trench 123 has a width of 2.0 μm and a depth of 0.3 μm, but may have other widths and/or depths in other embodiments.

After the formation of trench 123, a gate dielectric layer 121 is formed on the sidewalls and bottom of trench 123. In one embodiment, gate dielectric layer 121 has a thickness of 100 A and is formed by an oxidation process, but may be of other thicknesses, of other dielectric materials, and/or formed by other methods in other embodiments.

Figure 2:
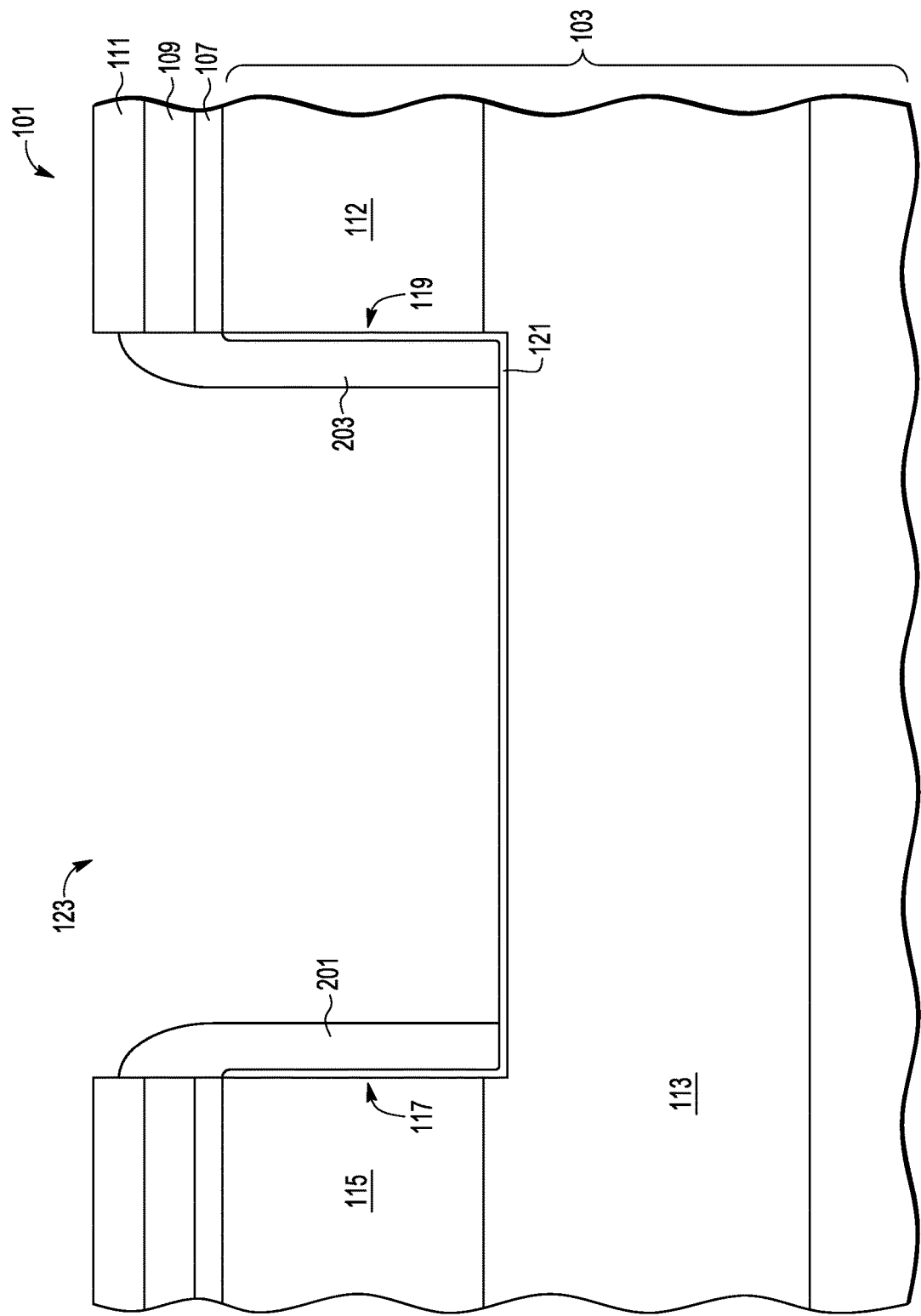

FIG. 2 is a partial cutaway side view of wafer 101 after conductive sidewall spacer structures 201 and 203 are formed on gate dielectric layer 121 on vertical sidewalls 117 and 119, respectively. In one embodiment, spacer structures 201 and 203 are formed of polysilicon, but may be formed of other conductive materials in other embodiments. In one embodiment, spacer structures 201 and 203 have thickness of 0.2 µm, but may have other thicknesses in other embodiments. In one embodiment, spacer structures 201 and 203 are formed by forming a layer of polysilicon over wafer 101 and then anisotropically etching the layer to below the top surface of layer 111 with an appropriate etch chemistry (e.g. a plasma etch using HBr/Cl).

Figure 3:
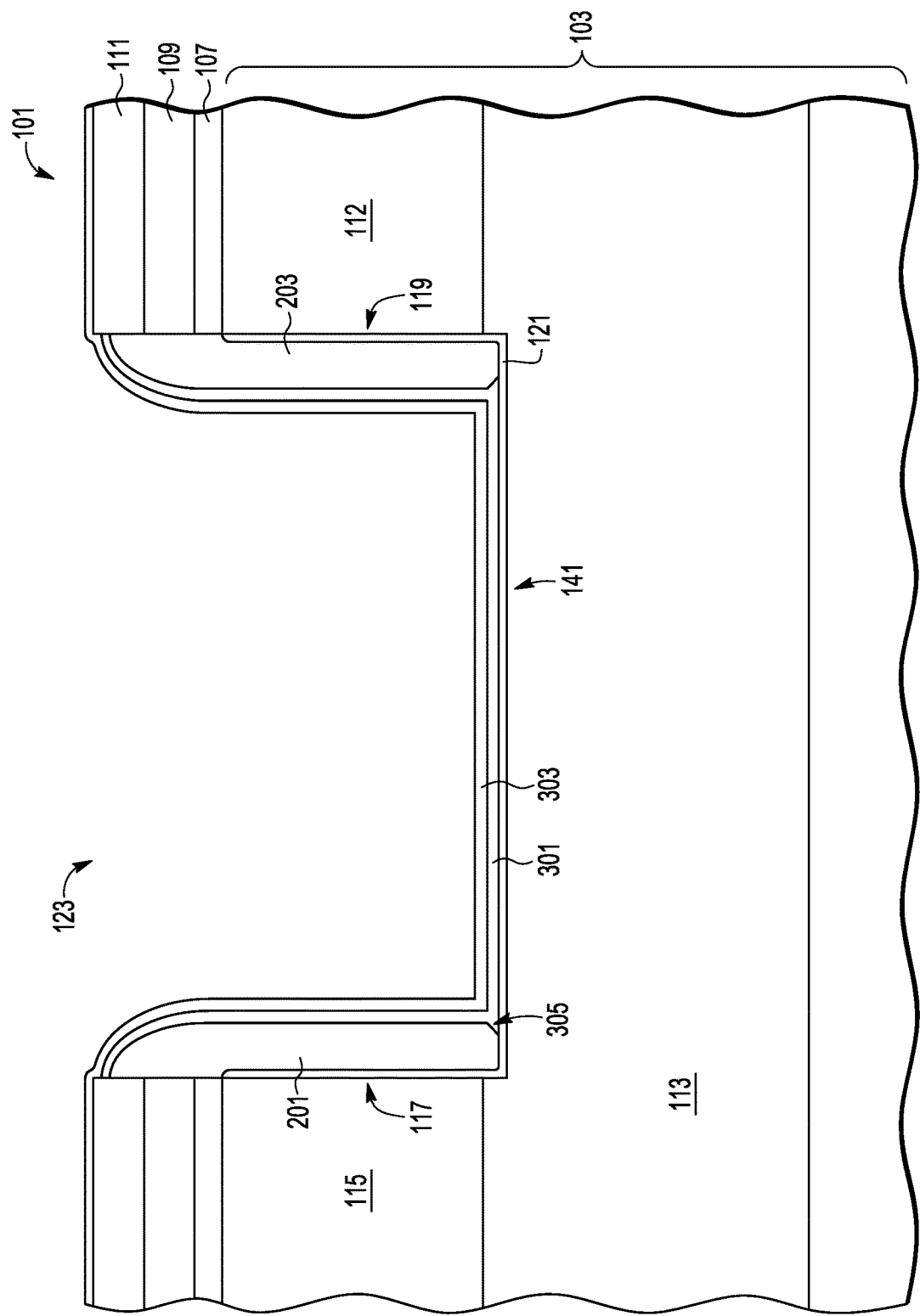

Referring to FIG. 3, after the formation of sidewall spacer structures 201 and 203, a layer 303 of oxide is formed in trench 123. In one embodiment, layer 303 is formed by an oxidation process, but may be formed by a deposition process and/or be made of other dielectric materials in other embodiments. In one embodiment, layer 301 has a thickness of 10 nm but may have other thicknesses in other embodiments.

In one embodiment, layer 301 is formed by a LOCOS (local oxidation of silicon). As part of the LOCOS process, spacer structures 201 and 203 are oxidized and layer 121 on lower surface level 141 thickens (the increase in thickness of layer 121 is shown as layer 301 in FIG. 3). As part of the LOCOS process, a bird's beak of oxide (305) forms beneath and edge of both spacer structures 201 and 203. As will be described later, this bird's beak of oxide at the corner of the conductive spacers acts to spread out the electrostatic fields in the extended drain regions during operation.

After the formation of layer 301, a second layer 303 of dielectric material is deposited over wafer 101 so as to thicken the thickness of the dielectric layer. In one embodiment, layer 303 is made of oxide and has a thickness in the range of 10-100 nm, but may have other thicknesses and/or be made of other materials in other embodiments. In some embodiments, layer 303 would not be formed.

Figure 4:
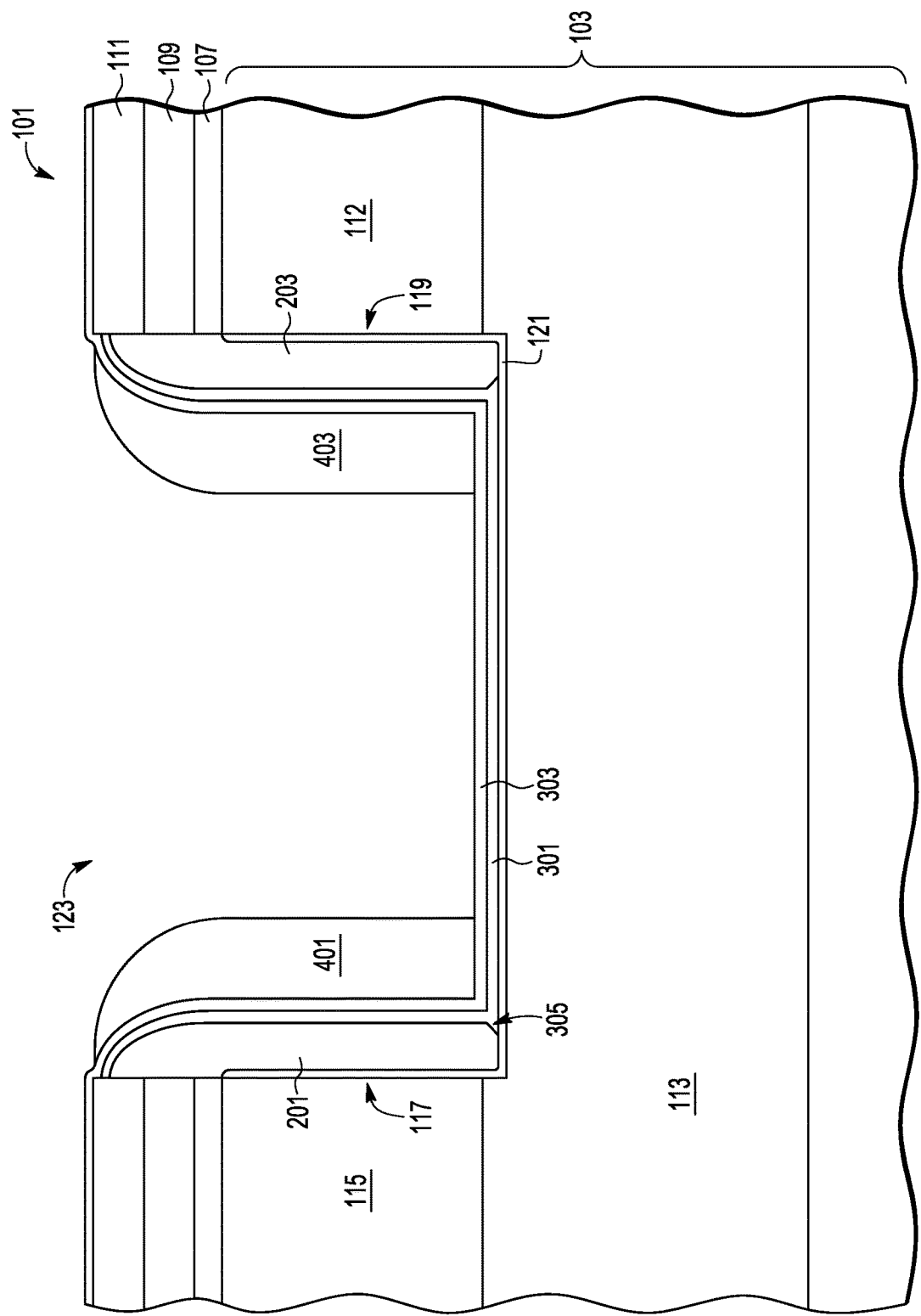

FIG. 4 is a partial cutaway side view of wafer 101 after conductive sidewall spacer structures 401 and 403 are formed laterally adjacent to conductive spacer structures 201 and 203 and vertical sidewalls 117 and 119, respectively. In one embodiment, spacer structures 401 and 403 are made of polysilicon and have a thickness of 0.1 µm, but may have other thicknesses and/or be made of other materials in other embodiments.

Figure 5:
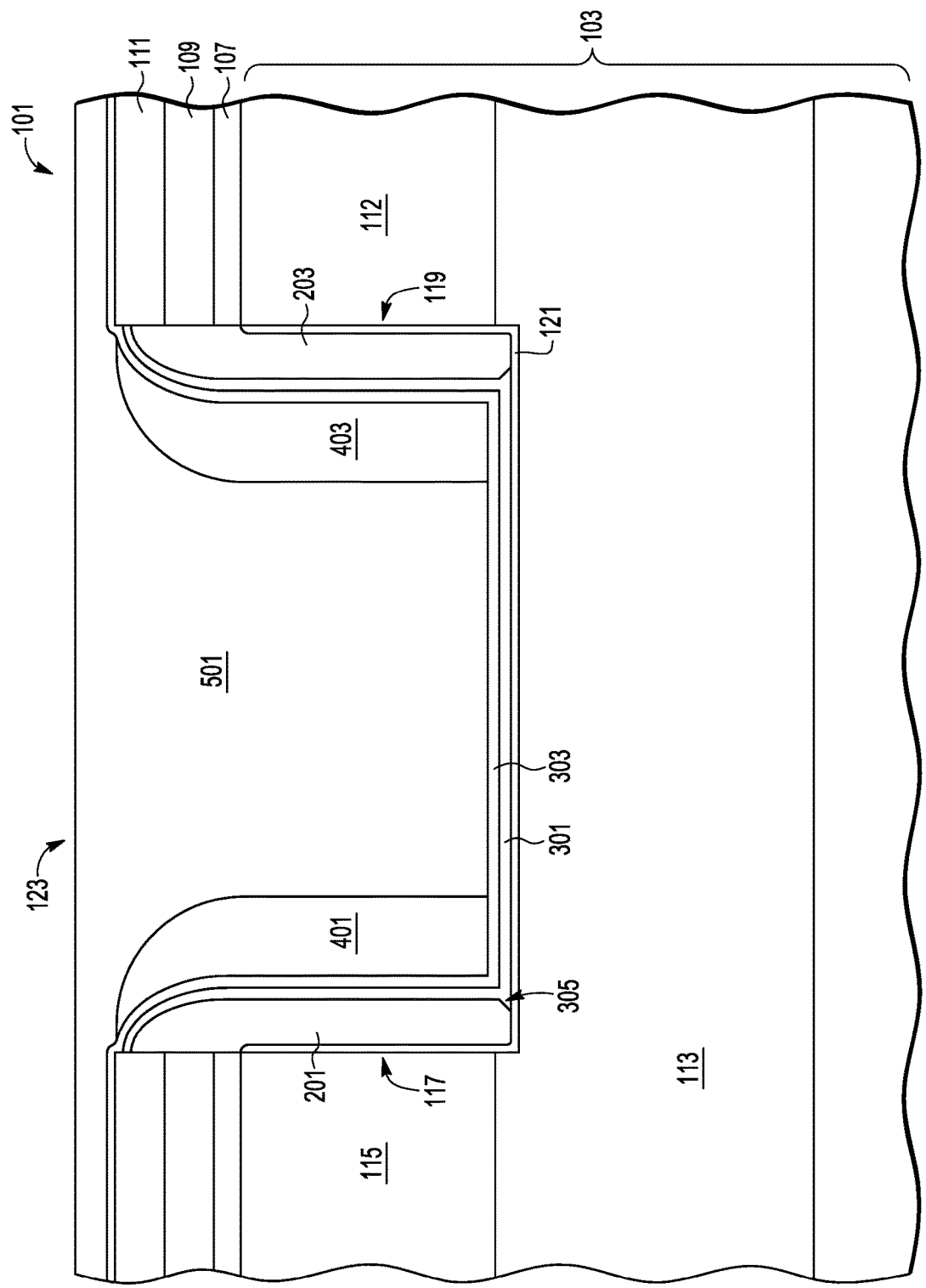

FIG. 5 is a partial cutaway side view of wafer 101 after dielectric 501 is deposited over wafer 101 to fill trench 123. In one embodiment, dielectric 501 is formed by a TEOS process.

Figure 6:
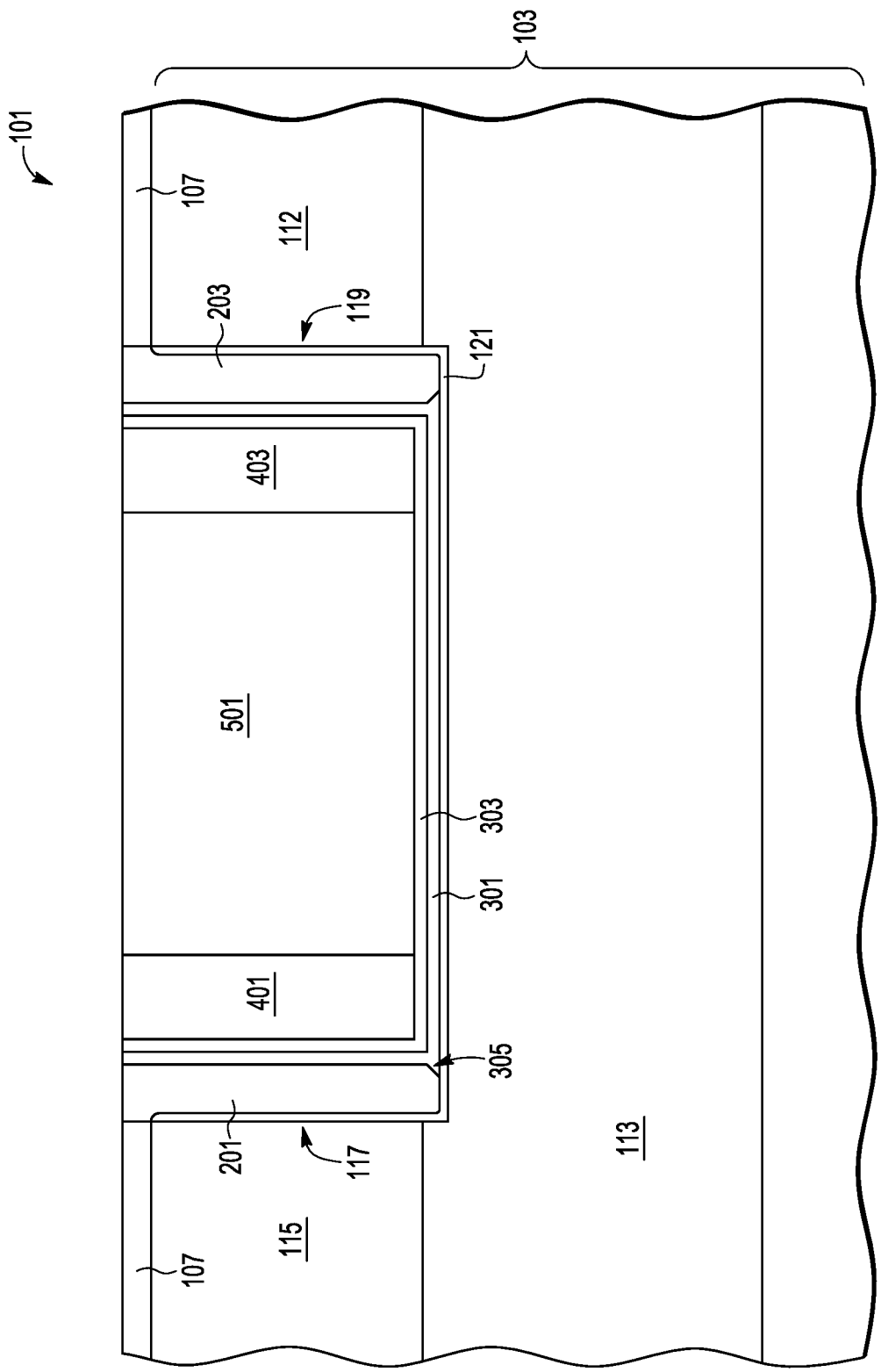

FIG. 6 is a partial cutaway side view of wafer 101 after wafer 101 has been planarized down to oxide layer 107. In one embodiment, wafer 101 is planarized by a CMP process, but may be planarized by other mechanisms in other embodiments. As shown in FIG. 6, planarization removes a top portion of spacer structures 201, 401, 403, and 203.

Figure 7:
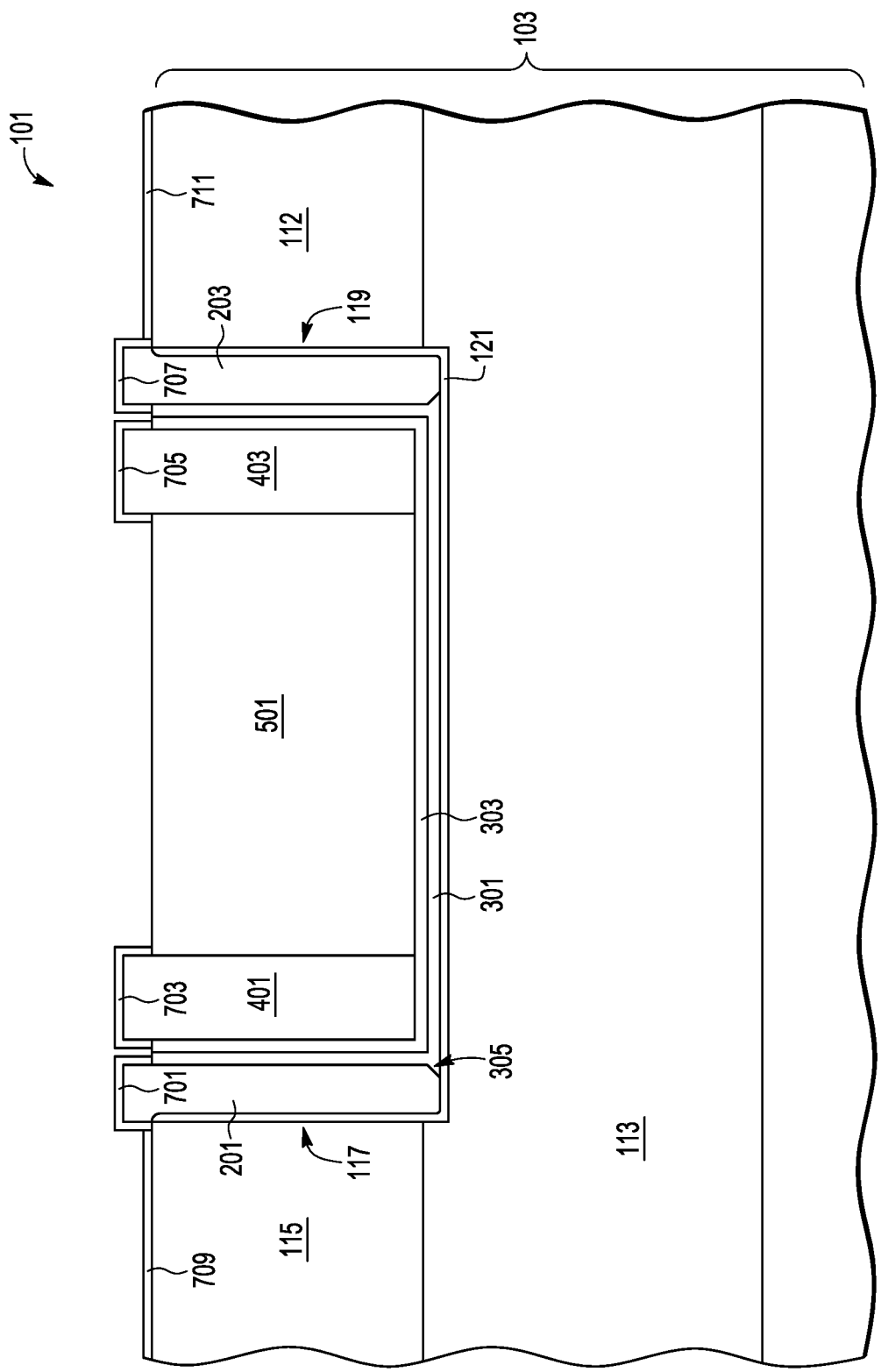

FIG. 7 is a partial cutaway side view of wafer 101 after oxide layer 107 and a top portion of dielectric 501 and layers 301 and 303 are removed. In one embodiment, these portions are removed by an isotropic etch of the oxide material of these structures. However, these structures maybe removed by other processes in other embodiments.

After the removal of the oxide layer, wafer 101 is subject to an oxidation process that forms oxide layers 701, 703, 705, 707, 709, and 711 on exposed silicon surfaces of substrate 103 and spacer structures 201, 401, 403, and 203.

Figure 8:
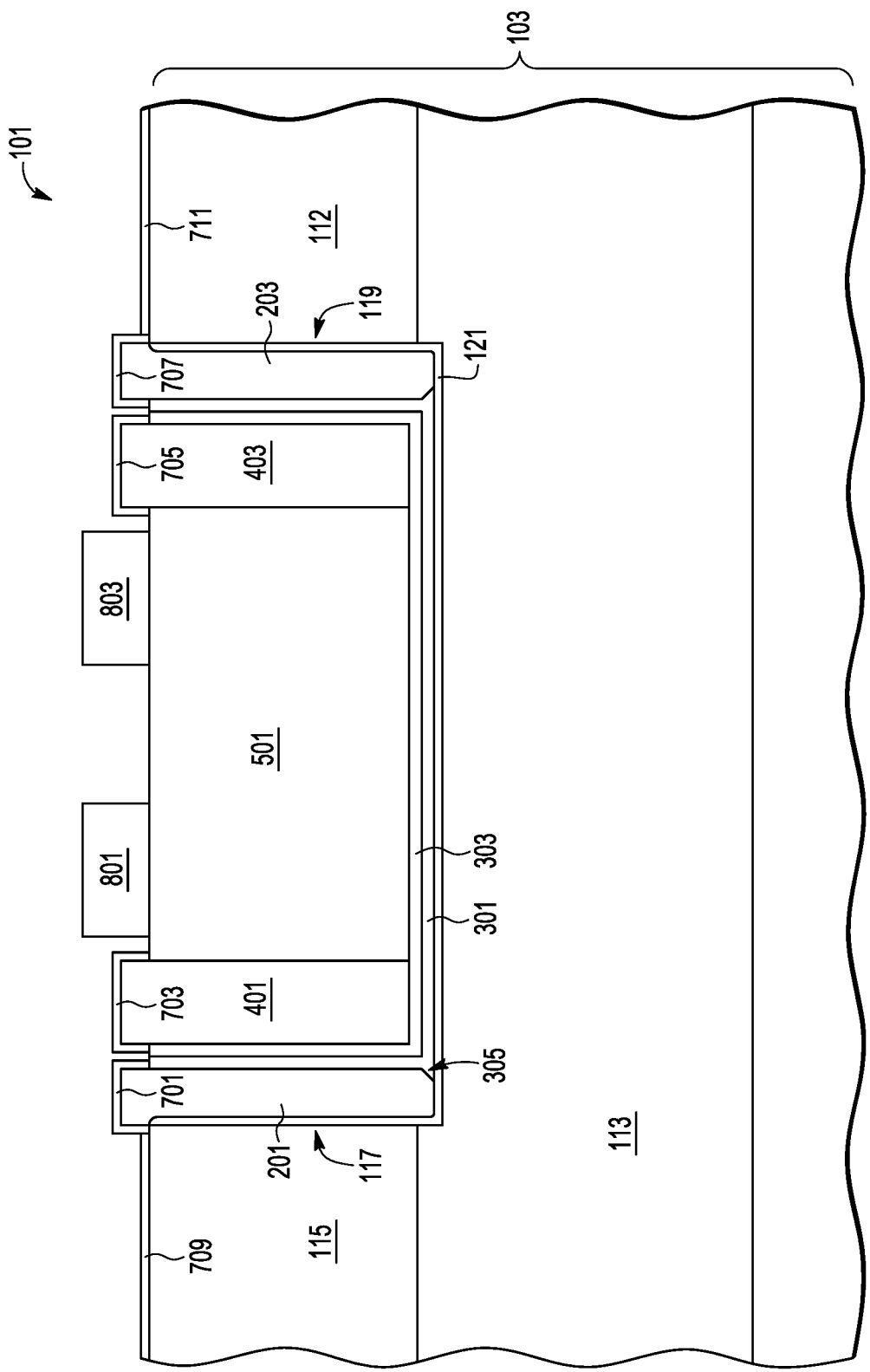

FIG. 8 is a partial cutaway side view of wafer 101 after field plate structures 801 and 803 are formed on wafer 101. In one embodiment, plate structures 801 and 803 are formed of a conductive material (e.g. polysilicon). In embodiment, structures 801 and 803 are formed by forming a layer of polysilicon (not shown) over wafer 101 and then patterning the layer by a photo-lithographic process such that structures 801 and 803 are photolithographically defined. In one embodiment, structures 801 and 803 have a thickness of 0.2 µm, but may have other thicknesses in other embodiments. In one embodiment, the polysilicon layer maybe patterned to form other structures on wafer 101 such as gate structures (not shown) for planar transistors (not shown).

Figure 9:
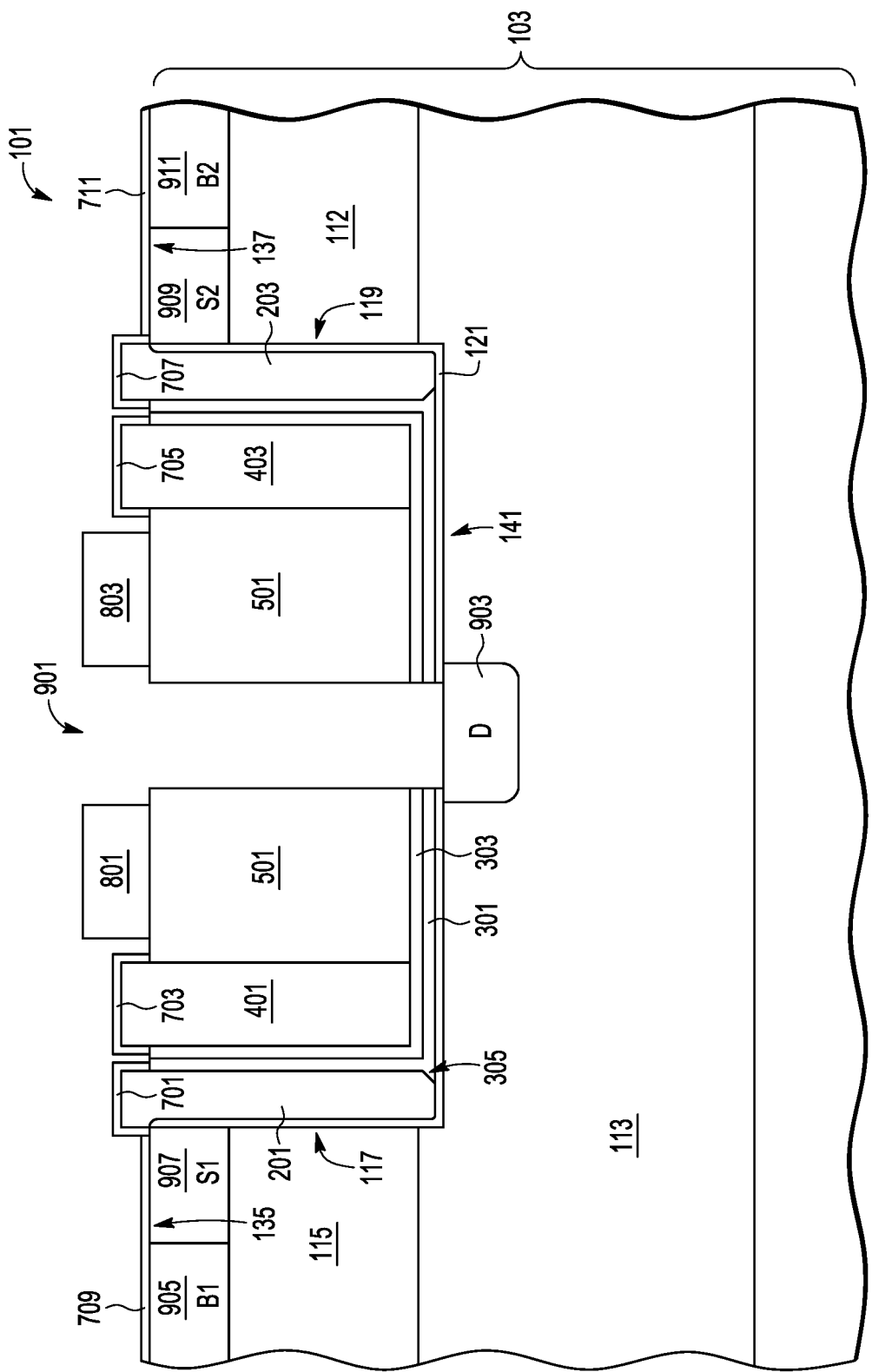

FIG. 9 shows a partial cutaway side view of wafer 101 after an opening 901 is formed in dielectric 501 and in layers 301 and 303 by selectively etching the materials of those structures through a patterned mask (not shown). N-type dopants are selectively implanted into substrate 103 through in an implant mask (not shown), though opening 901, and through lower surface level 141 to form drain region 903. During the same implantation process, N-type dopants are implanted through openings in the implant mask and through the upper surface levels 135 and 137 to form source regions 907 and 909. In some embodiments, region 903 may be implanted at a different time than regions 907 and 909.

In one embodiment, P-type dopants are implanted through another implant mask (not shown) though upper surface levels 135 and 137 to form body contact regions 905 and 911. In one embodiment, regions 905 and 911 are formed by selectively implanting through a mask, boron ions at a dose of 1.5e15 cm$^{-2}$ and at an energy of at 20 keV into well regions 115 and 112, respectively. Implantation is followed by an annealing step, e.g. rapid thermal annealing (RTA). Other P-type dopants may be implanted at other doses and/or at other energies in other embodiments.

In the embodiment shown, the body contact regions 905 and 911 are formed immediately adjacent to the source regions 907 and 909, respectively. However, in other embodiments, the body contact regions and source regions may be laterally separated.

Figure 10:
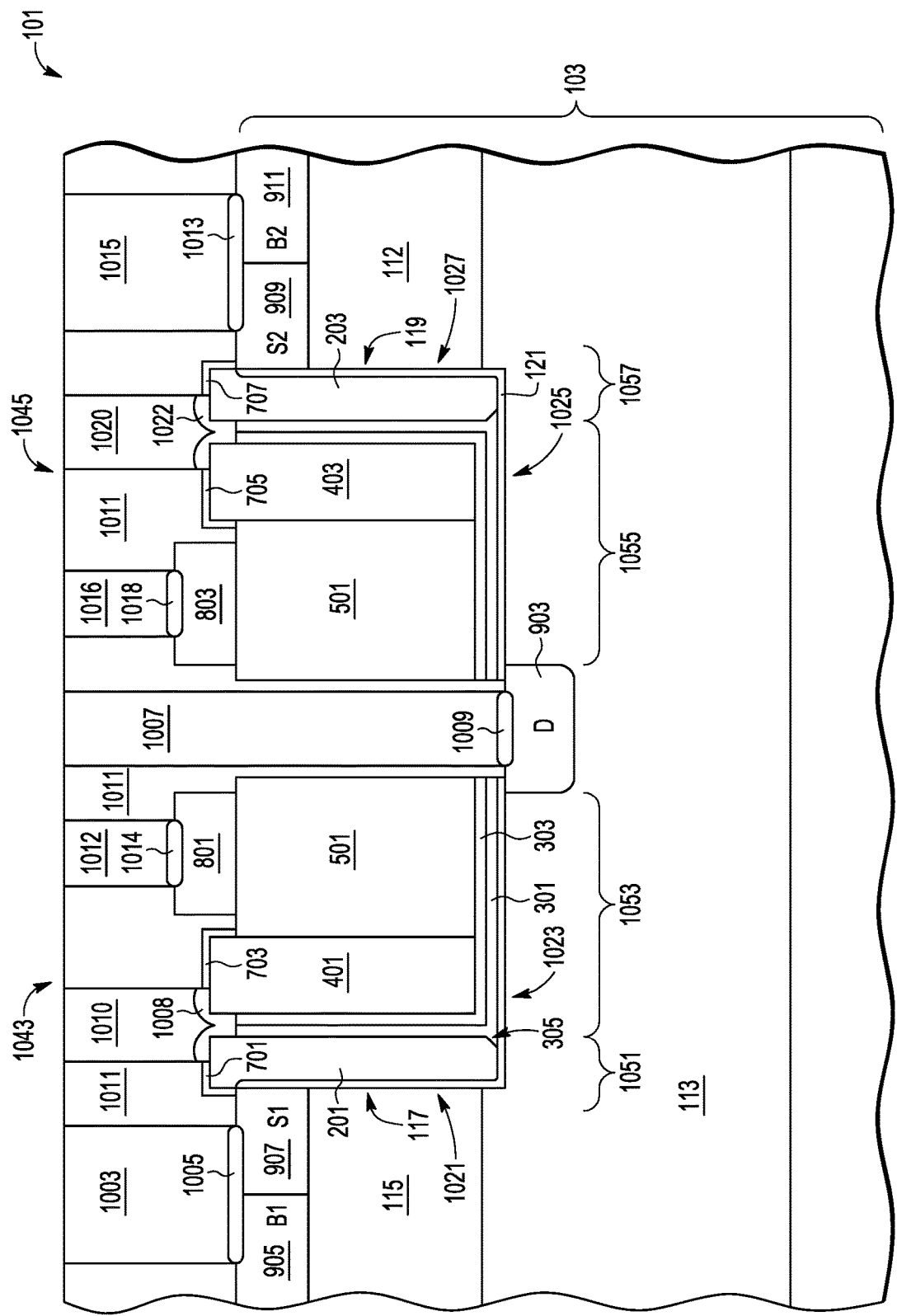

FIG. 10 shows a partial cutaway side view of wafer 101 after contacts are formed that are electrically coupled to the transistor structures shown in FIG. 10. Prior to the formation of the contacts, a layer 1011 of dielectric material is formed over wafer 101. In one embodiment, layer 1011 is an oxide layer form by a TEOS process. Openings are then formed in layer 1011. Afterwards, exposed silicon in the opening is silicided to form silicide structures 1005, 1008, 1014, 1018, 1022, and 1013. In one embodiment, the silicide structures are formed by depositing a metal (e.g. tungsten) over wafer 101, heating the wafer, and then removing the unreacted metal. Other embodiments may not include the silicide structures.

After the formation of the silicide structures, contacts are formed in the openings to electrically contact the silicide structures. Contact 1003 electrically contacts silicide structure 1005 which contacts body contact region 905 and source region 907. Contact 1010 electrically contacts silicide structure 1008 which contacts gate structure 201 and field plate structures 401. Contact 1007 electrically contacts silicide structure 1009. Contact 1012 electrically contacts silicide structure 1014 which contacts field plate structure 801. Contact 1016 electrically contacts silicide structure 1018 which contacts field plate structure 803. Contact 1020 electrically contacts silicide structure 1022 which contacts structure 403 and structure 203. Contact 1015 electrically contacts silicide structure 1013, which contacts body contact region 911 and source region 909. In some embodiments, the contact for a gate structure (e.g. 201) for a transistor (1043) may also contact the field plate structure (e.g. 801) that was photo-lithographically defined. In other embodiments, the gate structure (201) and photo-lithographically defined field plate structure (801) may be electrically connected together with higher level interconnects. In other embodiments, the gate structures (201) and field plate structures (401, 801) may be biased at different voltages.

Two transistors 1043 and 1045 are shown in FIG. 10. Transistor 1043 includes source region 907, channel region 1021 located in P-well region 115 along sidewall 117, drain region 903, and extended drain region 1023 which extends from channel region 1021 to drain region 903. Transistor 1043 also includes a gate (gate structure 201) and field plate structures 401 and 801. Transistor 1045 includes source region 909, channel region 1027 located in P-well region 115 along sidewall 119, drain region 903, and extended drain region 1025 which extends from channel region 1027 to drain region 903. Transistor 1045 also includes a gate (gate structure 203) and field plate structures 403 and 803.

In the embodiment shown, extended drain region 1023 includes an accumulation region 1051 in which includes a portion located beneath gate structure 201 and includes a drift region 1053 located beneath structures 401 and 801. Extended drain region 1025 includes an accumulation region 1057 which includes a portion located beneath gate structure 203 and includes a drift region 1055 located under structure 803 and structure 403.

In other embodiments, the field plate structures (e.g. 401 and 801) of a transistor are coupled to the source region (907) of the transistor instead of the gate structure (201) of the transistor. Also in other embodiments, gate structures 201 and 203 are coupled together and source regions 907 and 909 are coupled together to form a single transistor.

After the stage shown in FIG. 10, other processes may be performed on wafer 101 such as forming additional interconnect layers. Afterwards, external terminals e.g. bond pads are formed on wafer 101. Wafer 101 is then singulated into multiple die where each die includes at least two transistors having structures shown in FIGS. 1-5. Afterwards, the die are packaged in semiconductor packaging material to form integrated circuit packages where they are shipped to end use manufacturers to include in end use products such as automobiles, battery control systems, and industrial equipment. In other embodiments, a transistor device may include other structures and/or may be formed by other processes. Furthermore, additional process steps may be added to form other components on the same die.

Figure 11:
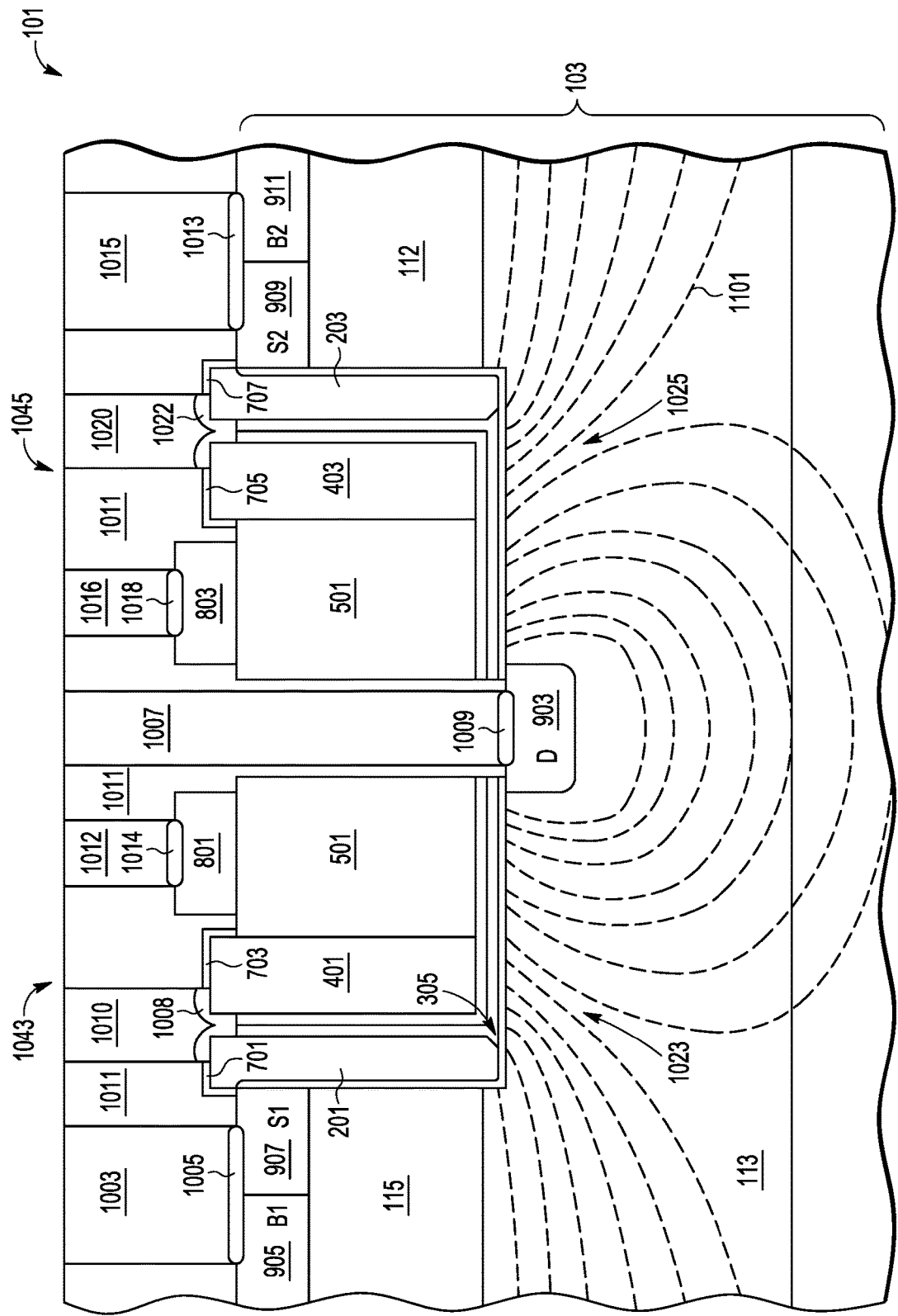
FIG. 11 is a partial side view illustration showing potential fields and the electrical coupling of a transistor device during an operating condition according to one embodiment of the present invention.

FIG. 11 shows a partial cross-sectional side view of transistors 1043 and 1045 during an off-state mode of operation according to one embodiment. In the embodiment shown, gate structures 201 and 203, conductive field plate structures 401, 801, 403, and 803, source regions 907 and 909, and body contact regions 905 and 911 are each grounded. 60V is applied to drain region 903.

FIG. 11 shows the equipotential lines 1101 representing the electrostatic fields of transistors 1043 and 1045 that occur in substrate 103. As can be shown in FIG. 10, the electrostatic potential between the higher drain voltage (60V) and the lower source voltages (ground) is distributed in the drain extension regions 1023 and 1025 that extends from the drain region 903 to the P well regions 115 and 112, respectively. In one embodiment, the amount of voltage sustained by transistor 1043 is dependent upon the lateral length between the area of drain region 903 and sidewalls 117 and 119, the field oxide layer (301, 303) thicknesses, and the depth and doping concentration of the P well regions 115 and 112 and drain extension region 113. In one embodiment, the breakdown voltage of transistors 1043 and 1045 are in the range of 10V to 100V, but may be of other voltages in other embodiments.

As shown in FIG. 11, the majority of extended drain regions 1023 and 1025 are horizontally oriented (e.g. extending from drain region laterally to the areas of the sidewalls 117 and 119, respectively). The channel regions 1021 and 1027 extend vertically along sidewalls 117 and 119, respectively. Having the channel regions be vertical allows for a reduction in area of the die over planar transistors wherein having the majority of the extended drain regions be horizontal allows for the transistors to be easily scalable for adjusting the breakdown voltage by increasing or decreasing the length from the edge of the drain region to the sidewalls 117 and 119, respectively. In some embodiments, the length of the channel region can be adjusted by varying the depth of the P-well regions (115 and 112) and/or the source regions 907 and 909.

In some embodiments, providing a bird's beak of oxide (305) under an edge of the gate structure 201 may allow for relaxed electric fields at locations directly below the bird's beak structure.

Figure 12:
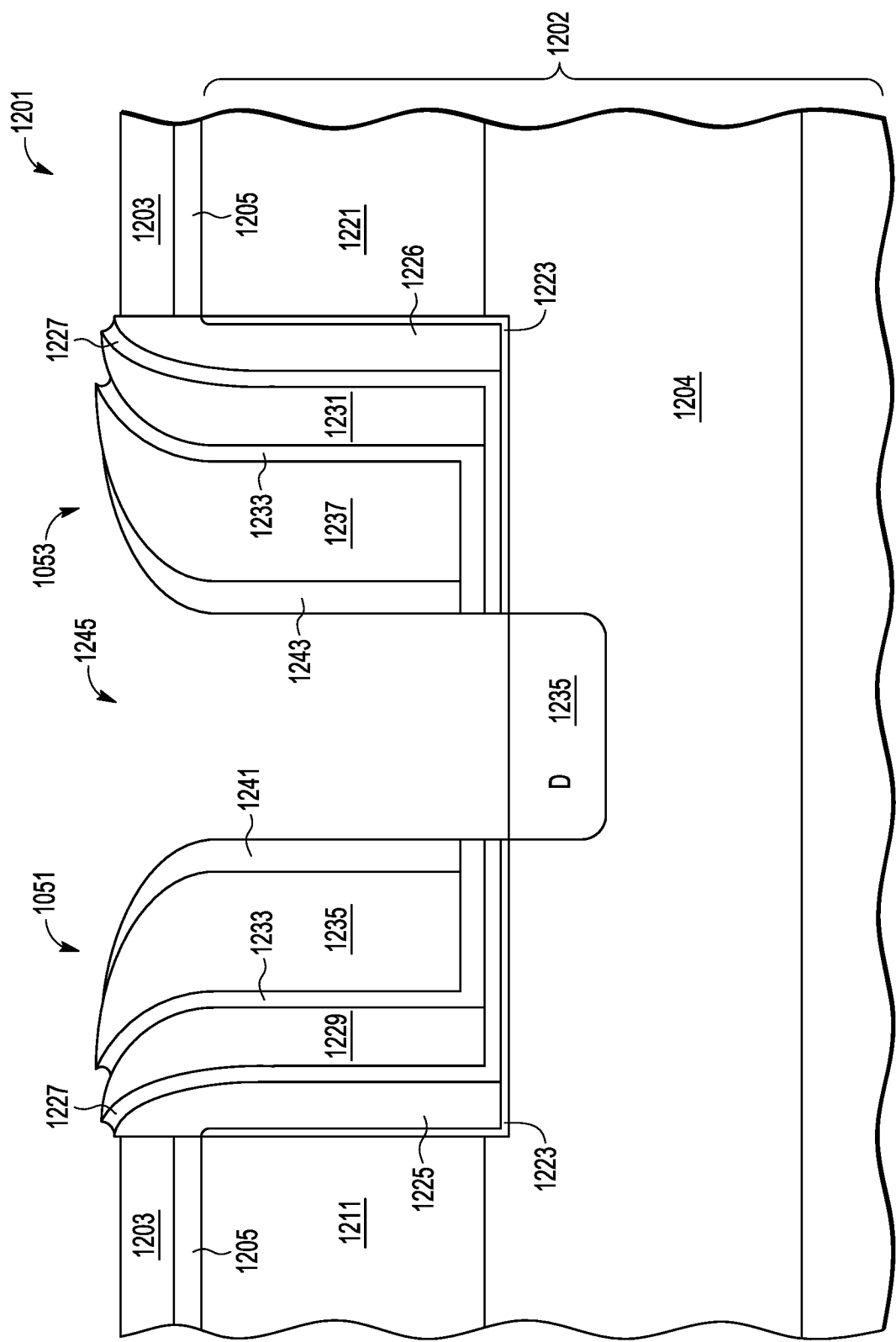
FIG. 12 sets forth a partial cutaway side view of a stage in the manufacture of a transistor device according to another embodiment of the present invention.

FIG. 12 is a partial cutaway side view of a wafer 1201 at a stage in the manufacture of a transistor device according to another embodiment of the present invention. Wafer 1201 includes a substrate 1202 having an N-type region 1204 and P-Well regions 1211 and 1221, which in one embodiment are similar to substrate 103, region 113 and P-well regions 115 and 112. Wafer 1201 also includes oxide layer 1205 and nitride layer 1203, which in one embodiment are similar to layers 107 and 109, respectively. Located in trench 1245 are oxide layer 1223, sidewall spacer gate structures 1225 and 1236, oxide layers 1227, and sidewall spacer field plate structures 1229 and 1231. Gate structures 1225 and 1226 and field plate structures 1229 and 1231 may be formed in a similar manner to gate structures 201 and 203 and field plate structures 1229 and 1231 in some embodiments.

After the formation of field plate structures 1229 and 1231, an oxide layer 1233 is deposited over wafer 101. A second set of sidewall spacer field plate structures 1235 and 1237 are formed in trench 1245. In one embodiment, structures 1235 and 1237 are made of polysilicon, but may be made of other conductive materials in other embodiments. In some embodiments, structures 1235 and 1237 are thicker than structures 1229 and 1231, but may be the same size or smaller in other embodiments. In one embodiment, the thickness of structures 1235 and 1237 are set such to accommodate for the distance between the sidewalls of trench 1245 and the lateral edges of drain region 1213. Afterwards, oxide sidewall spacers 1241 and 1243 are formed in trench 1245. In one embodiment, spacers 1241 and 1243 are formed to provide dielectric separation between a subsequently formed contact for drain region 1213 and field plate structures 1235 and 1237 and to define the extent of drain region 1213. As a result of the anisotropic etching of forming oxide sidewall spacers 1241 and 1243, the portions of oxide layers 1223, 1227, and 1233 between spacers 1241 and 1243 are removed to expose the portion of substrate 1202.

Afterwards N-type dopants are implanted into wafer 1201 to form drain region 1213. In the embodiment shown, nitride layer 1203 and the sidewall spacer structures in trench 1245 prevent the N type dopants from being implanted outside of region 1213. One advantage of forming a drain region in this manner is that the lateral edges of drain region 1213 will be aligned with the vertical trench sidewalls. With some other embodiments, a misalignment of an implant mask may create a device mismatch between two subsequently formed transistors. Afterwards, trench 1245 is filled with dielectric material and wafer 1201 is planarized wherein layer 1203 is removed. Wafer 1201 is subjected to an etch to remove the exposed oxide including layer 1205 and the exposed top portions of oxide layer 1223, 1227, and 1233, and the exposed top portions of spacers 1241 and 1243. After subjecting wafer 101 to an oxidation process to form a thin layer of oxide on exposed silicon surfaces, source and body contact regions are then formed in wafer 101. A dielectric layer, silicide structures, and contacts are then formed on wafer 101 (see the description of FIG. 10). In some embodiments, gate structures 1225 and 1226 can be formed by a photo-lithographic process.

Figure 13:
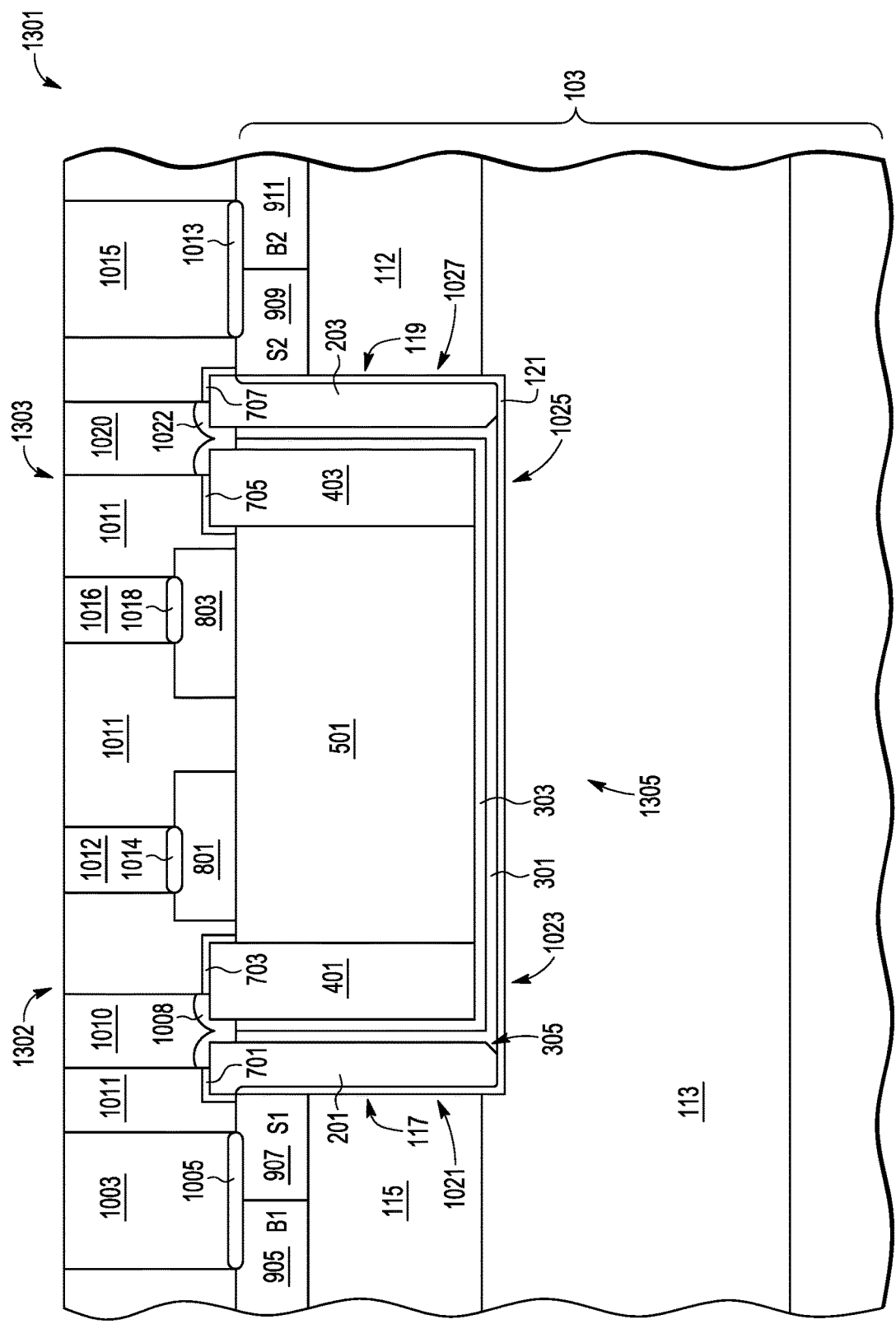
FIG. 13 sets forth a partial cutaway side view of a stage in the manufacture of a transistor device according to another embodiment of the present invention.

FIG. 13 shows a partial cutaway side view of wafer 1301 that includes a transistor device according to another embodiment of the present invention. In the embodiment shown, wafer 1301 is similar to wafer 101, with the structures in FIG. 13 being similar to the structures in FIG. 10 that have the same identification numbers.

The device shown in FIG. 13 is a back-to-back bidirectional transistor device that includes transistors 1302 and 1303 coupled in a back-to-back configuration. The bidirectional transistor device can be implemented as a bidirectional switch. A bidirectional transistor device is a device that can selectively block voltages in both directions and conduct current in both directions. Transistors 1302 and 1303 differ from transistors 1043 and 1045 of FIG. 10 in that the drain region for both transistors 1302 and 1303 is characterized as a "virtual drain" in that it is not biased at a particular voltage with a direct external contact and it is an internal node of a bi-directional device. In the embodiment shown, a virtual extended drain region 1305 extends from P well region 115 to P well region 112. Portions of extended drain region 1305 serve as the virtual extend drain region for transistors 1302 and 1303.

In one embodiment, circuit transistors 1302 and 1303 can be utilized as a switch between a node connected to source contact 1003 and a node connected to the source contact 1015, regardless of which node is at the higher voltage.

In one embodiment, the formation of transistors 1302 and 1303 is similar to the formation of transistors 1043 and 1045 except that an opening is not formed in dielectric 501 and layers 121, 301, and 303 to implant dopants into region 113 to form a drain region.

In other embodiments, the transistors may have other configurations, other structures, be of other types of transistors, and/or be formed by other methods. For example, in some embodiments, the drain region may be located on an opposite side of the trench from the source region instead of directly over the bottom portion of the trench. For example, in the view of FIG. 10, the drain region would be located where source region 909 is located. In some such embodiments of the drain being located on the opposite side of the trench, the gate sidewall spacer structure (203) and field plate sidewall spacer structure (403) located on the drain side of the trench would be removed (e.g. by selectively etching through a mask) and filled with a dielectric. Also, field plate structures (801 and 803) would not be separated. Also, although the transistors described above are NFETs, the processes shown and described above can be used to make PFETs as well by switching the net conductivity type of at least some of the semiconductor regions. The processes descried above may also be used to make other types of transistors in other embodiments.

As disclosed herein, a first structure is "directly over" a second structure if the first structure is located over the second structure in a line having a direction that is perpendicular with the generally planar major side of a wafer. For example, in FIG. 10, source region 907 is directly over region 113. Contact 1012 is not directly over drain region 903. As disclosed herein, a first structure is "directly beneath" a second structure if the first structure is located beneath the second structure in a line having a direction that is perpendicular with the generally planar major side of the wafer. For example, in FIG. 10, P-well region 115 is directly beneath contact 1003. P well region 112 is not directly beneath contact 1016. One structure is "directly between" two other structures in a line if the two structures are located on opposite sides of the one structure in the line. For example, in FIG. 10, structure 401 is located directly between structure 201 and structure 403 in a line in the cut away side view of FIG. 10. Region 903 is not located directly between structures 401 and 403 in a line. A "lateral line" is a line that is parallel with a generally planar major side of the wafer. In FIG. 10, structures 201 and 401 are located in a lateral line. Region 903 and region 909 are not located in a lateral line. As disclosed herein, a first structure is "laterally separated" from a second structure if there is separation between the two structures in a line that is parallel with a generally planar major side of the wafer. For example, in FIG. 4, sidewall spacer structures 201 and 401 are laterally separated from each other. As disclosed herein, a "lateral distance" is the distance in a direction that is parallel with a generally planar major side of the wafer. As disclosed herein, a "vertical distance" is the distance in a direction that is perpendicular with a generally planar major side of the wafer. A "vertical component sidewall" of a trench is a portion of a trench sidewall having a profile that overall, the majority component of the portion is vertical even though it may also have a horizontal component or that it may have minor horizontal discontinuity at an interior location of the sidewall portion. For example, a portion of a sidewall sloped at 70 degrees may be considered a vertical component sidewall portion. A sidewall spacer structure is a structure defined by its self-aligned spacing from a sidewall and is not photo lithographically defined.

Features shown or described herein with respect to one embodiment may be implemented in other embodiments shown or described herein.

In one embodiment, a method for forming a transistor device includes forming a vertical component sidewall in a semiconductor material. The vertical component sidewall separates an upper surface level and a lower surface level of the semiconductor material. The method includes forming a first conductive sidewall spacer structure laterally adjacent to the vertical component sidewall. The first conductive sidewall spacer structure is utilized as a control terminal for a transistor. The method includes forming a dielectric layer directly over the lower surface level. The dielectric layer includes a portion adjacent to the first conductive sidewall spacer structure. The method includes forming a second conductive sidewall spacer structure laterally adjacent to the first conductive sidewall spacer structure and directly over the portion of the dielectric layer and directly over the lower surface level. The second conductive sidewall spacer structure is utilized as a field plate for the transistor. The method includes forming a channel region for the transistor including a portion located in the vertical component sidewall. The method includes forming a source region for the transistor in the semiconductor material directly under the upper surface level. The source region including a portion located above the channel region. The transistor includes an extended drain region in the semiconductor material including at least a portion located directly below the second conductive sidewall spacer structure.

In another embodiment, a transistor device includes a source region for a transistor located in a first portion of a semiconductor material. The first portion has an upper surface at a first level. A second portion of a semiconductor material has an upper surface at a second level that is lower than the first level. A sidewall of the semiconductor material separating the first portion from the second portion. The transistor device includes a control terminal sidewall spacer structure for the transistor laterally adjacent to the sidewall and located directly over the second portion. The control terminal sidewall spacer structure is vertically separated from the second portion by dielectric by a first vertical distance. The transistor device includes a field plate sidewall spacer structure for the transistor laterally adjacent to the sidewall and to the control terminal sidewall spacer structure. The field plate sidewall spacer structure located directly over the second portion. The field plate sidewall spacer structure vertically separated from the second portion by dielectric by a second vertical distance. The second vertical distance is greater than the first vertical distance. The transistor device includes a channel region for the transistor including a portion located in the sidewall laterally adjacent to the control terminal sidewall spacer structure and below the source region. The transistor device includes an extended drain region for the transistor. The extended drain region includes a portion located directly below the field plate sidewall spacer structure in the second portion.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a transistor device comprising:
    forming a vertical component sidewall in a semiconductor material, the vertical component sidewall separating an upper surface level and a lower surface level of the semiconductor material;
    forming a first conductive sidewall spacer structure laterally adjacent to the vertical component sidewall, the first conductive sidewall spacer structure is utilized as a control terminal for a transistor;
    forming a dielectric layer directly over the lower surface level, the dielectric layer including a portion adjacent to the first conductive sidewall spacer structure;
    forming a second conductive sidewall spacer structure laterally adjacent to the first conductive sidewall spacer structure and directly over the portion of the dielectric layer and directly over the lower surface level, wherein the second conductive sidewall spacer structure is utilized as a field plate for the transistor;
    forming a channel region for the transistor including a portion located in the vertical component sidewall;
    forming a source region for the transistor in the semiconductor material directly under the upper surface level, the source region including a portion located above the channel region;
    wherein the transistor includes an extended drain region in the semiconductor material including at least a portion located directly below the second conductive sidewall spacer structure.

2. The method of claim 1 wherein the forming the dielectric layer over the lower surface level includes utilizing a LOCOS process to form an oxide material.

3. The method of claim 2 wherein the oxide material formed by the LOCOS process include dielectric material formed directly under the previously formed first conductive sidewall spacer structure.

4. The method of claim 1 wherein the semiconductor material is part of a wafer, wherein the forming the first conductive sidewall spacer structure and the second conductive sidewall spacer structure includes planarizing the wafer to remove a top portion of the first conductive sidewall spacer structure and the second conductive sidewall spacer structure.

5. The method of claim 4 wherein after the planarizing, forming a field plate structure for the transistor, the field plate structure is located in an area of the wafer that is laterally between an area of the second conductive sidewall spacer structure and an area of a drain region for the transistor, wherein the area of the second conductive sidewall spacer structure is located laterally between an area of the first conductive sidewall spacer structure and the area of the field plate structure.

6. The method of claim 5 wherein the forming the field plate structure includes forming a layer of conductive material over the wafer and then patterning the layer of conductive material.

7. The method of claim 1 further comprising forming a field plate structure for the transistor, the field plate structure located in an area of a wafer that is laterally between an area of the second conductive sidewall spacer structure and an area of a drain region of the transistor, wherein the area of the second conductive sidewall spacer structure is located laterally between an area of the first conductive sidewall spacer structure and the area of the field plate structure.

8. The method of claim 7 wherein the field plate structure is characterized as a sidewall spacer structure laterally adjacent to the second conductive sidewall spacer structure, wherein the semiconductor material is located in a wafer, wherein the forming the first conductive sidewall spacer structure, the second conductive sidewall spacer structure, and the field plate structure includes planarizing the wafer to remove a top portion of the first conductive sidewall spacer structure, the second conductive sidewall spacer structure, and the field plate structure.

9. The method of claim 1 further comprising:
    forming a second vertical component sidewall in a semiconductor material, the second vertical component sidewall separating a second upper surface level and the lower surface level of the semiconductor material, the second vertical component sidewall facing the vertical component sidewall;
    forming a third conductive sidewall spacer structure laterally adjacent to the second vertical component sidewall, the third conductive sidewall spacer structure is utilized as a control terminal for a second transistor, wherein the dielectric layer includes a second portion laterally adjacent to the third conductive sidewall spacer structure;

forming a fourth conductive sidewall spacer structure laterally adjacent to the third conductive sidewall spacer structure and directly over the dielectric layer and directly over the lower surface level, wherein the fourth conductive sidewall spacer structure is utilized a field plate for the second transistor;

forming a second channel region for the second transistor including a portion located in the second vertical component sidewall;

forming a second source region for the second transistor in the semiconductor material directly under the second upper surface level, the second source region including in a portion located above the second channel region;

wherein the second transistor includes a second extended drain region including at least a portion located directly below the fourth conductive sidewall spacer structure.

10. The method of claim 9 further comprising:
forming a shared drain region for the transistor and the second transistor in the semiconductor material directly below the lower surface level.

11. The method of claim 9 wherein the extended drain region and the second extended drain region are characterized as virtual extended drain regions, wherein the transistor and the second transistor are coupled in a back-to-back configuration.

12. The method of claim 1 further comprising:
forming a drain region for the transistor device in the semiconductor material directly below the lower surface level.

13. The method of claim 1, further comprising:
forming a second vertical component sidewall in the semiconductor material, the second vertical component sidewall separating a second upper surface level and the lower surface level of the semiconductor material, the second vertical component sidewall facing the vertical component sidewall;

forming a drain region for the transistor in the semiconductor material directly below the second upper surface level.

* * * * *